United States Patent [19]
Kalnitsky

[11] Patent Number: 5,811,330
[45] Date of Patent: Sep. 22, 1998

[54] METHOD OF FABRICATING AN OVERVOLTAGE PROTECTION DEVICE IN INTEGRATED CIRCUITS

[75] Inventor: Alexander Kalnitsky, Grenoble, France

[73] Assignee: SGS-Thomson Microelectronics S.A., Saint Genis, France

[21] Appl. No.: 901,946

[22] Filed: Jul. 29, 1997

Related U.S. Application Data

[62] Division of Ser. No. 822,860, Mar. 24, 1997, which is a continuation of Ser. No. 403,006, Mar. 10, 1995, abandoned.

[30] Foreign Application Priority Data

Mar. 14, 1994 [FR] France .................................. 94 03302

[51] Int. Cl.⁶ ................................................ H01L 21/8234
[52] U.S. Cl. ......................... 438/238; 438/672; 438/467; 438/134
[58] Field of Search ............................ 438/238, 133–140, 438/237, 983, 467, 281, 672; 257/173, 355, 356, 522

[56] References Cited

U.S. PATENT DOCUMENTS

| | | | |
|---|---|---|---|
| 3,748,522 | 7/1973 | Geppert | 313/310 |
| 4,096,541 | 6/1978 | Bohin et al. | 361/120 |
| 4,129,894 | 12/1978 | Chen | 361/117 |
| 4,586,105 | 4/1986 | Lippmann et al. | 361/187 |
| 4,736,271 | 4/1988 | Mack et al. | 361/91 |
| 4,891,730 | 1/1990 | Saddow et al. | 361/111 |
| 5,312,777 | 5/1994 | Cronin et al. | 438/134 |
| 5,516,705 | 5/1996 | Webb et al. | 438/134 |

OTHER PUBLICATIONS

French Search Report from French Patent Application 94 03302, filed Mar. 14, 1994.

Institute of Electrical and Electronics Engineers, 11th Annual Proceedings Reliability Physics; New York, Apr. 1973, Las Vegas Nevada, USA, pp. 198–202, L.W. Linholm et al. "Electrostatic Gate Protection Using and ARC Gap Device".

Patent Abstracts of Japan, vol. 9, No. 154 (E–325) Jun. 28, 1985 & JP–A–60 034 053 (Nippon Denki).

Patent Abstracts of Japan, vol. 10, No. 384 (E–466) Dec. 23, 1986 & JP–A–61 174 727 (Toshiba).

*Primary Examiner*—Joni Chang
*Attorney, Agent, or Firm*—Wolf, Greenfield & Sacks, P.C.

[57] ABSTRACT

An overvoltage protection device, for inclusion within an integrated circuit, which comprises at least two conductive elements separated by a gas filled gap.

13 Claims, 3 Drawing Sheets

METHOD OF FABRICATING AN OVERVOLTAGE PROTECTION DEVICE IN INTEGRATED CIRCUITS

This application is a division of application Ser. No. 08/822,860, filed Mar. 24, 1997, entitled INTEGRATED OVERVOLTAGE PROTECTION DEVICE HAVING ELECTRODES SEPARATED BY A GAS-FILLED CAVITY, which in turn is a continuation of application serial number 08/403,006, filed Mar. 10, 1995 abandoned.

BACKGROUND OF THE INVENTION

1. Field of the Invention

The invention relates to solid-state integrated circuits.

Semiconductor integrated circuits are very susceptible to damage from high voltages (for example electrostatic discharges) which may accidentally be applied to input or output connectors during or after manufacture, for example while performing die pick and place, wire bonding during the packaging process, or when placing a packaged circuit in a socket. These risks are due to static charging of die when they are peeled from a plastic backing sheet, electrical discharge from points of a bonding machine, and discharge from human operators, respectively. Semiconductor devices produced by a MOS (Metal-Oxide-Semiconductor) process are particularly vulnerable to high voltages applied across a gate oxide layer.

Protection structures are included in many integrated circuits and become conductive above a certain threshold voltage and discharge charges away from the circuit and to for example ground potential. These structures must return to a non-conductive state as soon as the high applied voltage has ceased. Such structures are usually made within the semiconductor material as avalanche diodes connected to the input and output pads.

2. Discussion of the Related Art

FIG. 1 shows a circuit using known overvoltage protection devices. An input terminal 4 is connected via a node 5 to the circuitry 6 to be protected, and also to first terminals of first and second avalanche protection diodes 7, 8. A second terminal of first avalanche protection diode 7 is connected to a supply voltage $V_{DD}$ 9, and a second terminal of the second avalanche diode protection device 8 is connected to ground 10. In the diagram, the diodes are shown in the correct orientation for a positive supply voltage $V_{DD}$. Their cathodes are connected to the more positive of the two terminal voltages, and they are hence nominally non-conductive. However, as with all semiconductor diodes, a small reverse leakage current will flow, whose magnitude depends on the surface area of the diode junction and the doping levels of the semiconductor material on either side of the junction.

If a high positive voltage is applied to the input terminal 4, the diode 7 becomes forward biased and hence conductive. The high voltage is then connected to the $V_{DD}$ voltage, preventing any damage to the circuit 6. If the input voltage is sufficiently high, the avalanche voltage of the protection device 8 will be reached. This protection device will also become conductive then and connect the input voltage to ground 10.

If a high negative voltage is applied to the input terminal 4, the avalanche protection diode 8 becomes forward biased and hence conductive. The high negative voltage is then connected to ground, thus preventing any damage to the circuit 6. If the input voltage is sufficiently negative, the avalanche voltage of the protection device 7 will be reached. This protection device will also become conductive then and connect the input voltage to the $V_{DD}$ voltage.

Such diode protection devices suffer from several drawbacks. They occupy a large area due to the large power dissipation capability required. These diodes also pass a certain leakage current, even at normal operating voltages, which contributes unnecessarily to the integrated circuit's current consumption. Leakage current of such diodes under normal operating conditions may increase as a result of electrical overstress. In addition, these leakage currents usually increase further with repeated breakdowns of the diodes. Avalanche diodes require a certain amount of time to turn on. With a rapidly rising voltage input, the diodes may not become conductive before serious damage has been done to the circuit supposedly protected. The avalanche voltage is determined by the doping levels of the semiconductor on either side of the diode junction. To achieve the required avalanche voltage, special process steps may have to be included in the manufacturing process of the integrated circuit, increasing manufacturing costs. On the other hand, the avalanche diodes may be made from doping levels already included in the process for the fabrication of transistors and other structures, which, will however produce avalanche diodes with a non-optimal avalanche voltage.

It has already been proposed (L. W. Linholm et al, IEEE Annual Proceedings Reliability Physics 1973; Japanese patent application JP-A-60 034053 to use arc gap structures in integrated circuit protection devices.

The first of these documents uses two conductors, defined in a same metallic layer, formed on an insulating layer and separated by a photolithographically defined slit. This slit defines a gas filled gap. As the conductors lie on a surface of an insulating layer, the conductors are separated by equal lengths of insulator material and of gas filled gap. The insulator material is thus stressed by application of high voltages between the conductors. Additionally, the slit has a minimum width defined by the minimum feature size of the photolithographic process. This is currently of the order of 500 nm. The device described becomes conductive over 300 V, and thus does not provide useful protection to integrated circuits, where an applied voltage of the order of 15 V may cause severe damage.

The second document proposes a sandwich structure of two conductors separated by a dielectric region. Part of the dielectric region between the two conductors is etched away to form a gap. A further dielectric layer is formed over the surface of the resulting structure, without filling the gap, to form a gas filled cavity.

Both of the above described structures always produce parallel arrangements of a gas filled gap, and a dielectric filled gap, having identical gap lengths, between the two conductors. Such a structure may result in destructive breakdown of the dielectric, especially at its edges, meaning that the protection offered will be less effective after one or more applications of a high voltage to the structure.

Furthermore, the second document suggests using a gas filled gap in parallel with a gate oxide layer of the integrated circuit, however, it is often this same gate oxide layer which needs to be protected against having a high voltage applied.

SUMMARY OF THE INVENTION

An object of the current invention is to provide an overvoltage protection device of minimum dimensions within an integrated circuit.

A further object is to provide such a device which may be produced by process steps already included substantially in a standard integrated circuit manufacturing process.

A further object is to provide such a device which becomes conductive fast enough and at voltages low enough such that no damage is caused to the circuit protected before the device becomes conductive.

A further object is to provide such a device which does not pass an appreciable leakage current under normal operating conditions.

A further object is to provide such a device with a predeterminable, repeatable breakdown voltage.

A further object is to provide such a device which is equally effective in protecting against both positive and negative overvoltages appearing on the input or output pads.

According to the invention, a structure is provided within an integrated circuit comprising at least two conductive elements having opposing faces, separated by a short, gas filled gap which extends laterally beyond the smaller of the opposing faces. The gas filled gap may be enclosed within a cavity bound by the two conductive elements and at least one non-conductive material. The gap between the two conductive elements may preferably have a length of less than 100 nm, more particularly between 10 nm and 90 nm. At least one conductive element may consist of tungsten. Each of the two conductive elements may consist of a material different from the material of the other conductive element. At least one of the non-conductive elements may include silicon dioxide. Such a structure may comprise connection means respectively connected to each of said conductive elements and to points of the integrated circuit between which an overvoltage protection is desired.

Such a structure may comprise:
  a column of a first conductive material supported at its base and over a semiconductor substrate;
  a conductor of a second conductive material separated from the column by a gap; and
  an electrically insulating material enclosing a cavity which contains at least part of the side surface of the column and at least a facing part of the surface of the conductor. The column may be supported on its base by one or more layers of conductive material. The layer of supporting conductive material may include polysilicon, titanium or titanium nitride.

Within such a structure, the electrical connection to the column is preferably provided by a connection layer of conductive material deposited onto the upper surface of the column, the lower surface of said connection layer forming part of the inner surface of the cavity. The connection layer may preferably be a layer of aluminium alloy, commonly used in IC manufacturing. The first conductive material may preferably be tungsten. The second conductive material may preferably be tungsten. The first conductive material may be different from the second conductive material.

The column is preferably supported on a thin layer of thickness equal to the length of the gap, which is preferably between 10 nm and 90 nm. The thin layer of material may be a composite layer of titanium and titanium nitride.

An example fabrication process is also provided for the manufacture of a structure as described above, which includes the steps of:
  providing a substrate including a first layer of insulating material on its upper face;
  depositing a layer of a first conductive material on the upper surface of the first layer of insulating material;
  etching a first aperture in the first conductive material;
  depositing a second layer of insulating material to cover the upper surface of the first conductive material and to fill the first aperture;
  etching a second aperture in the second layer of insulating material, the second aperture covering the whole area of the first aperture;
  etching a third aperture in the first layer of insulating material directly below the first aperture;
  covering the entire surface of the structure, including the inner surfaces of the apertures, with a thin layer of material;
  filling the apertures with a second conductive material;
  etching the thin layer of material until its upper surface is below the lower surface of the first layer of conductive material; and
  depositing a sealing layer of material over the surface of the structure without such material taking the place of the etched portion of the thin layer.

The process may further include the step of depositing a third layer below the first layer of insulating material, the first and second layers of insulating material being selectively etchable with respect to said third layer. The third layer may comprise polysilicon. The substrate may comprise silicon. The sealing layer may be a layer of aluminium alloy.

BRIEF DESCRIPTION OF THE DRAWINGS

One way of carrying out the invention is described in detail below, with reference to FIGS. 2 to 9 of the accompanying figures wherein.

DETAILED DESCRIPTION

Figure 2:
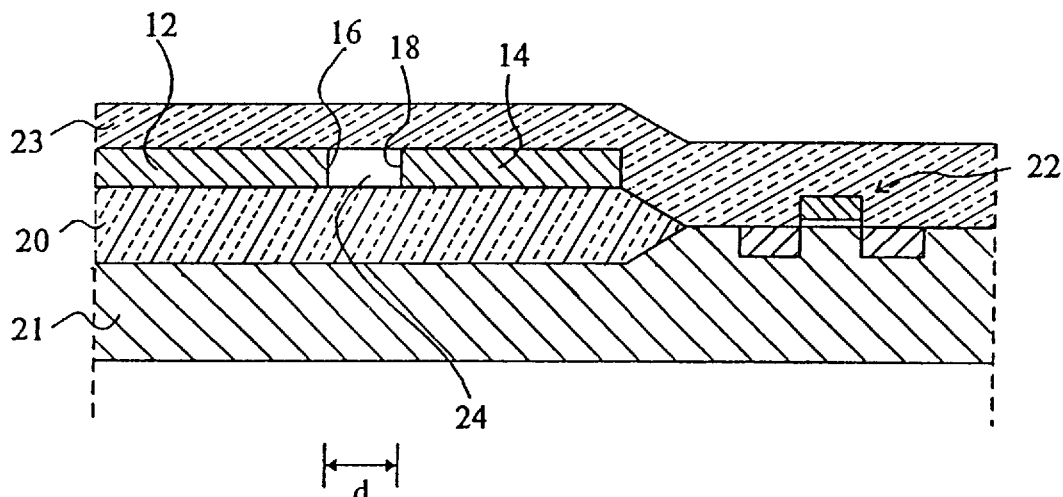
FIG. 2 shows the structure of an embodiment of an overvoltage protection device.

FIG. 2 shows a general structure of an overvoltage protection device. Two electrodes 12, 14 are separated by a very small distance d between their opposing faces 16, 18 respectively. The two electrodes are disposed on an electrically insulating layer 20. This layer 20 is itself disposed upon a semiconductor substrate 21 which includes devices such as MOS transistors 22. A second electrically insulating layer 23 may be disposed over the two electrodes 12, 14 to define a cavity 24 which is evacuated, or filled with a gas.

The overvoltage protection device thus produced affords protection between the two electrodes 12, 14. One electrode may be connected to the input or output pad to be protected, while the other electrode may be connected to a supply or ground voltage. When the potential difference between the two electrodes is sufficient, as in the case of an applied overvoltage, the gas in cavity 24 will become conductive and a current will pass between the electrodes 12, 14. The invention is interested in protecting an integrated circuit against the application of voltages around 15 V. To achieve protection against such small voltages, a gap length d of less than 100 nm, more particularly, in the range 10 nm to 90 nm, is required. For such small gaps, the breakdown voltage depends mainly on the material and surface roughness of the electrodes and their distance of separation d, rather than upon the gas species and pressure, as gas discharge over closely spaced electrodes behaves very much like a vacuum breakdown, which is electrode limited.

Were different materials used for the two electrodes, different breakdown voltages in each direction would be obtained, and a varying degree of diode characteristics can be achieved. The breakdown voltages would be Bkv+$\Delta\psi$ in one direction and Bkv−$\Delta\psi$ in the other where $\Delta\psi$ is the difference in the work functions of the two materials and Bkv is the average of the two breakdown voltages. The difference in work function may be up to about 1.2 V.

A specific embodiment of a protection device according to the current invention shall be described. This specific embodiment is manufactured using a process entirely compatible with current semiconductor manufacturing techniques for a fabrication process including plugged vias.

Figure 3:
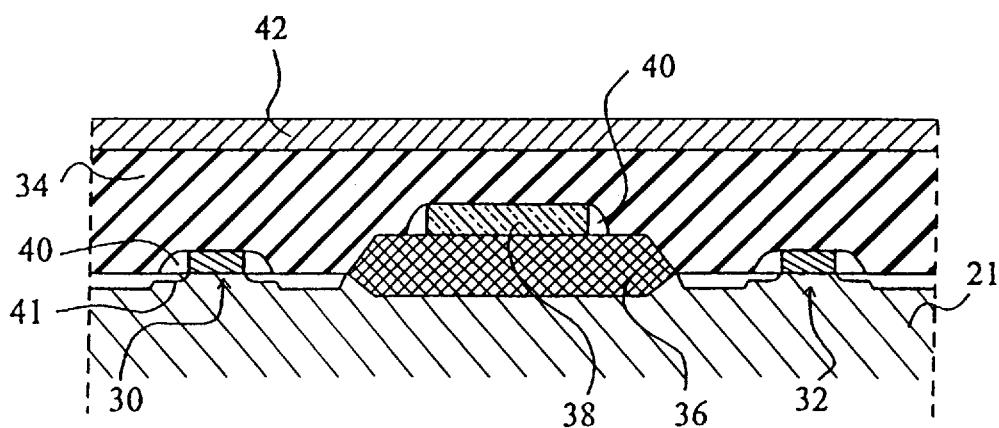
FIGS. 3 to 8 show an embodiment of a protection device according to the invention at different stages during a manufacturing process.

FIG. 3 shows a cross-section of a semiconductor integrated circuit on a substrate 21 after the semiconductor devices, for example MOS transistors 30, 32 have been completed. A dielectric layer 34 is disposed over the semiconductor devices, and regions of field oxide 36 are typically placed between separate areas of circuitry, for isolation purposes.

According to an aspect of the invention, a layer of material 38, with respect to which the material of the dielectric layer 34 is selectively etchable, is present upon the field oxide 36 and below the dielectric layer 34 in the location chosen for the protection device. Preferably, the dielectric layer 34 is composed of silicon dioxide and the layer 38 is composed of polysilicon which is formed at the same time as the polysilicon gate layers of the transistors 30, 32. Spacers 40 and the lightly doped regions 41 in the semiconductor thereunder may be present or not, according to the process employed. A first conductive layer 42 is deposited over the whole wafer.

Figure 4:
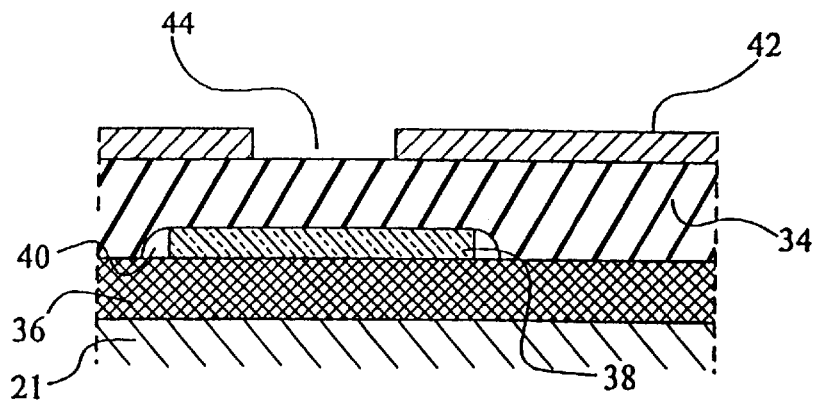

FIG. 4 shows, according to the invention, an aperture 44 which is opened in the conductive layer 42 above a portion of the layer 38 by a photographic masking and etching step.

Figure 5:
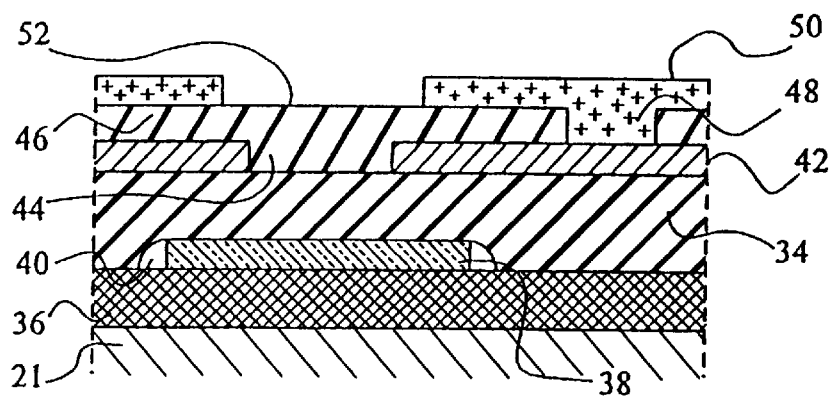

With reference to FIG. 5, a second layer of dielectric 46 is then applied to the whole wafer and planarized according to a standard process.

A further photographic masking and etching step may be used to define and open via cuts 48 in the second dielectric layer in places where electrical connections (vias) will be required between the first conductive layer 42 and a subsequent conductive layer. A layer of photoresist 50 is deposited over the surface of the wafer and patterned to expose a region 52 of the second dielectric layer 46. According to the invention, the exposed region 52 is larger than and completely covers aperture 44 in the first conductive layer. This allows tolerance for mask alignment errors.

An etching step, selective to the dielectric materials, is applied to the wafer. The etch must be anisotropic, for example a CHF$_3$ plasma etch with silicon oxide dielectric layers. According to the invention, this step is continued for a time long enough to etch through the exposed region 52 of the second dielectric layer 46 and the first dielectric layer 34 below the aperture 44, and until the etching stops on reaching the layer 38. The photoresist layer 50 is then removed.

Figure 6:
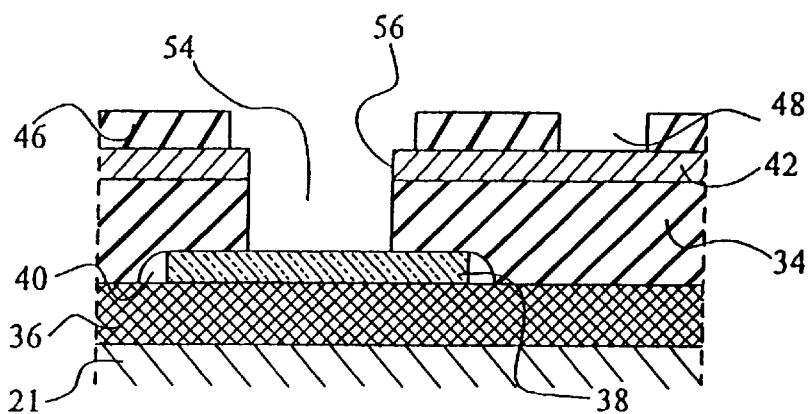

The structure of FIG. 6 results. A hole 54 is open from the surface of the second dielectric layer 46 to the upper surface of the layer 38. A side surface 56 of the conductive layer 42 is exposed inside the hole, and the hole in the first dielectric layer 34 is of identical dimensions to the aperture 44 in the conductive layer 42. The optional via cut 48 in the second dielectric layer 46, exposes the surface of the conductive layer 42.

Figure 7:
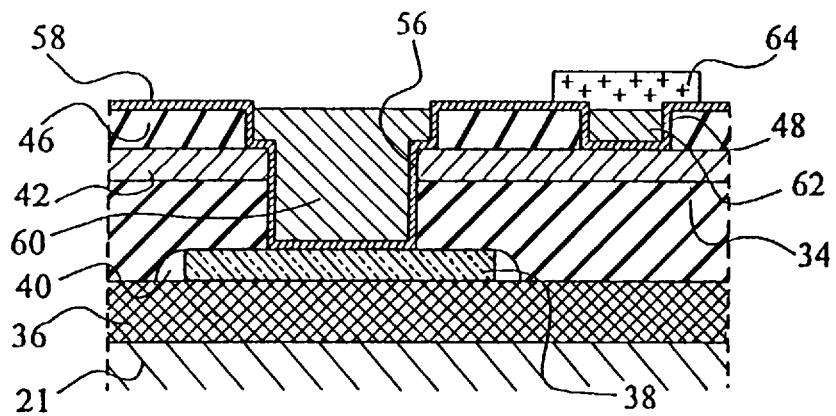

Referring to FIG. 7, and according to the invention, the whole surface of the structure, including the walls and the bottom of the hole 54, is covered with a vapour deposited layer 58. This layer should be thin, conformal and adherent to the surface, and selectively etchable to the materials of the layer 38, dielectric layers 34, 46, first conductive layer 42, and the conductive material described below. If, as in FIG. 7, via cuts 48 are included, this layer 58 should also be electrically conductive. Preferably, layer 58 consists of a layer of titanium followed by a layer of titanium nitride. The via cut 48 and the hole 54 are then filled with a conductive material to form a column 60 and a via 62, whose upper surfaces are approximately coplanar with the upper surface of the second dielectric layer 46. This conductive material may be tungsten, which has been vapour deposited to a thickness sufficient to fill all holes in the second dielectric layer, and then etched without a mask, with an etch selective to the conductive material for a suitable time until the surface of the layer 58 is exposed in all places other than where vias or the devices of the invention are to be fabricated. A fluorine plasma etch may be used if the conductive material is tungsten and the material of the layer 58 is titanium/titanium nitride.

A photoresist mask 64 is placed over all vias. An etch selective to the material of the layer 58, for example a chlorine-containing plasma for a titanium/titanium nitride layer 58, is applied to the wafer. This etch continues for a time long enough to remove the layer 58 almost as far as the bottom of the hole. A minimum amount of material of the layer 58 must remain, to retain the column 60, but the layer 58 must be etched to a depth well beyond the lower surface of the first conductive layer 42. The removal of the layer 58 thus causes a gap to be formed between the column 60, and a portion of the first conductive layer 42. The edge of the first conductive layer 42 and an opposing portion of the surface of the column 60 are opposing faces, and the gap extends laterally beyond the edges of the smaller of the two opposing faces, in this case, the edges of the first conductive layer 42. There is no dielectric material present between the two opposing faces, nor in the gap adjacent to the opposing faces. There is thus no parallel arrangement of a gas filled gap and a dielectric filled gap having identical gap lengths.

The etchant must be carefully chosen to achieve the necessary selectivity between the material of layer 58, the material of the column 60 and other exposed materials.

Figure 8:
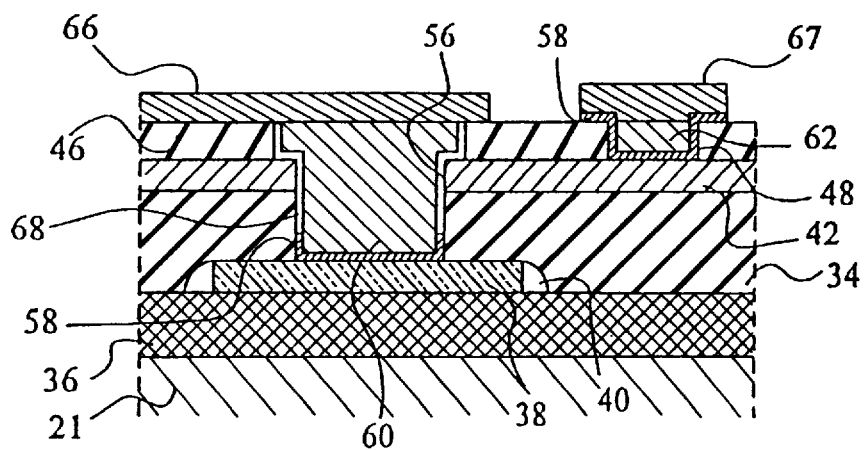

FIG. 8 shows the structure after the mask 64 has been removed and a second conductive layer has been applied to the whole surface of the wafer and patterned with masking and etch steps. After patterning, two portions 66, 67 of the second conductive layer remain over the column 60 and the via 62, respectively. The deposition of the second conductive layer seals the cavity 68 left by the removal of the layer 58. Cavity 68 extends laterally beyond the edges of the first conductive layer, and it contains gas of the species and pressure used during the vapour deposition of the second conductive layer. This pressure may be approximately $10^{-7}$ to $10^{-3}$ torr ($1.3\times10^{-5}$ to $1.3\times10^{-1}$ Pa). As discussed above, the species and pressure of this gas is of little importance to the operation of the device of the invention. One part 66 of the second conductive layer makes electrical contact with the column 60 and a second part 67 of the second conductive layer makes contact with the first conductive layer by means of the via 62. The second conductive layer may be composed of aluminium, an alloy thereof or any metallic interconnect material used in the fabrication of integrated circuits.

Figure 9:
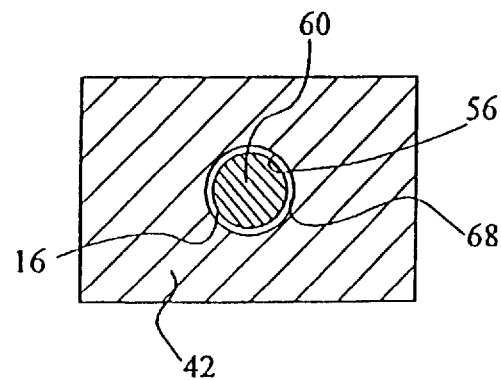
FIG. 9 shows a plane view of the protection device of FIG. 8.

FIG. 9 shows a plane view of the structure of FIG. 8 at the level of the first conductive layer 42. The size of the column 60 may correspond to the minimum via size allowable in the process. The first opposing face, being the surface 56 of the first conductive layer 42 is therefore annular, and the second opposing face, being a portion of the surface 16 of column 60 is cylindrical. The gap 68 extends out of the plane of the drawing, above and below the first conductive layer 42.

The separation of the opposing faces 56, 16 is equal to the thickness of the layer 58 as deposited and may therefore be controlled by conventional process parameters. This thickness is typically 10 to 90 nm, which is much smaller than the minimum separation which could be produced by the photographic masking and etching steps of current semiconductor processes.

The structure of the invention affords overvoltage protection between the column 60 and the first conductive layer 42. Electrical connection between the structure of the invention and the circuit to be protected is made, in the illustrated embodiment, by using elements 66, 67 of the second conductive layer and vias 62.

Figure 1:
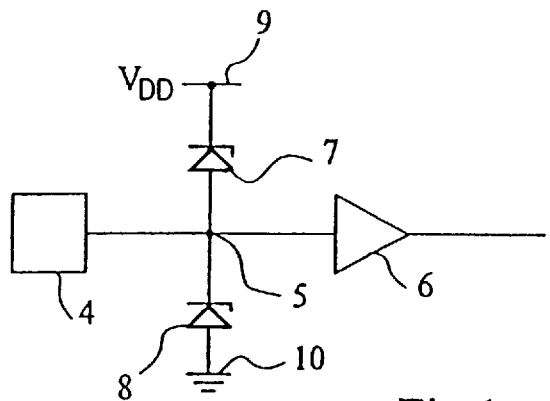
FIG. 1 is a circuit diagram showing the use of a conventional input or output protection device.

Use may be made of the structure of the invention in the circuit shown in FIG. 1 where an overvoltage protection device 8 of the invention is connected to the node 5 and to ground, 10. Since the protection device of the invention is equally effective for both positive and negative overvoltages, it is not necessary to include the other protection device 7.

A device of the invention having a gap of 20 nm will have a breakdown voltage of approximately 10 V, dependant on the material and surface quality of the electrodes. The breakdown voltage of the device may be predetermined by the choice of the thickness of layer 58.

The device of the invention is not degraded in terms of current leakage at normal operating voltage by the application of high voltages to the I/O pad. Operation of the protection device and the circuit protected will not suffer, even after multiple electrostatic discharges. At normal operating voltages, no current is passed by the structure of the invention. The device occupies a very small area; the column 60 occupies an area of the order of 1 $\mu m^2$ in a current technology, with the entire structure occupying an area of approximately 10 $\mu m^2$.

While one particular embodiment of the invention has been described in detail, numerous other variants will be apparent to those skilled in the art. The layer 38 may be used as a conductor to the column 60 with a non conductive layer being deposited to seal the cavity 68. Further conductive layers may be placed between the first (42) and second (66, 67) conductive layers to form a protection device with more than two terminals. The first conductive layer 42 may be patterned so as to present a plurality of isolated surfaces within the cavity 68, again to produce a protection device with more than two terminals. Use of differing materials for the two electrodes 12, 14 could produce a device having a useful diode characteristic, without the leakage current and possible damage associated with semiconductor diodes subjected to high terminal voltages. The layer 38 may be omitted entirely and the etching, of the thin layer 58 controlled by timing the etch step in order to etch a hole 54 of the required depth. The structure of the invention may also be used in applications not related to overvoltage protection, such as a threshold device or a sawtooth waveform generator where a charge is cyclically built up on one electrode until discharged by the structure.

Having thus described at least one illustrative embodiment of the invention, various alterations, modifications, and improvements will readily occur to those skilled in the art. Such alterations, modifications, and improvements are intended to be within the spirit and scope of the invention.

Accordingly, the foregoing description is by way of example only and is not intended as limiting. The invention is limited only as defined in the following claims and equivalents thereto.

What is claimed is:

1. A method for manufacture of an overvoltage protection structure, the method including steps of:
    providing a substrate including a first layer of insulating material disposed on an upper surface of the substrate;
    depositing a layer of first conductive material on an upper surface of the first layer of insulating material;
    selectively etching a first aperture, having a first area, in the first conductive material;
    depositing a second layer of insulating material to cover an upper surface of the first conductive material and to fill the first aperture;
    selectively etching a second aperture, in the second layer of insulating material, and through the first aperture, the second aperture having a second area which is equal to at least the first area;
    selectively etching a third aperture in the first layer of insulating material directly below the first aperture to form the third aperture having a third area substantially equal to the first area, consecutive apertures of the second aperture, the first aperture, and the third aperture forming a column hole;
    depositing a thin layer of material over an upper surface of the second layer of insulating material and over sidewalls and a bottom surface of the column hole;
    filling the column hole with a second conductive material;
    etching the thin layer of material until an upper surface of a remaining thin layer of material is disposed below a lower surface of the layer of first conductive material so as to provide a gas filled gap between the first conductive material and the second conductive material and a cavity which extends laterally beyond upper and lower surfaces of the layer of first conductive material; and
    depositing a sealing layer of material over the overvoltage protection structure, wherein the sealing layer does not occupy the gas filled gap.

2. The method according to claim 1, further including a step of:
    depositing a third layer that supports the overvoltage protection structure, disposed on top of the substrate and below the first layer of insulating material, the first layer of insulating material and the second layer of insulating material being selectively etchable with respect to said third layer.

3. The method according to claim 2, wherein the third layer comprises polysilicon.

4. The method according to claim 1, wherein the substrate comprises silicon.

5. The method according to claim 1, wherein the first conductive material and the second conductive material are different.

6. The method according to claim 1, wherein the first conductive material is tungsten.

7. The method according to claim 1, wherein the second conductive material is tungsten.

8. The method according to claim 1, wherein the sealing layer is substantially composed of aluminum.

9. The method according to claim 1, wherein the thin layer of material has a thickness in a range between 10 nm and 90 nm.

10. The method according to claim 9, wherein the thin layer of material is a composite layer of titanium and titanium nitride.

11. A method for fabricating an overvoltage protection device, in an integrated circuit, that protects a protected circuit from a charge accumulation at an external pin coupled to the protected circuit, the method including steps of:

a) providing a first planarized layer, comprised of a first insulating material;

b) depositing a first conductive layer over the first planarized layer;

c) selectively etching a first aperture, having a first area, in the first conductive layer;

d) providing a second planarized layer, comprised of a second insulating material, over the first conductive layer;

e) selectively etching the second insulating material through the first aperture to form a second aperture over the first area, and selectively etching the first insulating material to form a third aperture under the first area, a column hole, having side walls and a bottom surface, being defined by consecutive apertures of the second aperture, the first aperture, and the third aperture;

f) depositing a thin film, the thin film also covering the side walls and the bottom surface of the column hole;

g) filling the column hole with a second conductive material, a filled column hole defining a conductive column of the second conductive material;

h) selectively etching the thin film until a sufficient portion of the thin film on the side walls has been etched away so that a top surface of a remaining thin film is below the first conductive layer and a gap is defined between the conductive column and the second insulating material, between the conductive column and the first conductive layer, and between the conductive column and at least part of the first insulating material;

i) providing an enclosing layer over the integrated circuit so that the gap is enclosed;

j) coupling a first terminal of the overvoltage protection device to the conductive column; and k) coupling a second terminal of the overvoltage protection device to the first conductive layer.

12. The method for fabricating the overvoltage protection device according to claim 11, the method further including a step of:

providing a support for the overvoltage protection device under the bottom surface of the column hole.

13. The method for fabricating the overvoltage protection device according to claim 11, the method further including a step of:

providing a via structure between the first conductive layer and the second terminal.

* * * * *